(12) United States Patent
Eun

(10) Patent No.: US 7,754,561 B2
(45) Date of Patent: Jul. 13, 2010

(54) METHOD FOR FABRICATING ISOLATION FILM IN SEMICONDUCTOR DEVICE

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 660 days.

(21) Appl. No.: 11/758,500

(22) Filed: Jun. 5, 2007

(65) Prior Publication Data
US 2008/0160721 A1 Jul. 3, 2008

(30) Foreign Application Priority Data
Dec. 29, 2006 (KR) .................. 10-2006-0138819

(51) Int. Cl.
*H01L 21/8238* (2006.01)
(52) U.S. Cl. .................. 438/221; 257/E21.545
(58) Field of Classification Search .................. 438/221, 438/424, 431, 435, 437, 689, 700; 257/E21.545, 257/E21.546
See application file for complete search history.

(56) References Cited

U.S. PATENT DOCUMENTS

| | | | |
|---|---|---|---|
| 6,335,261 B1 * | 1/2002 | Natzle et al. .................. 438/435 |
| 6,531,377 B2 * | 3/2003 | Knorr et al. .................. 438/435 |
| 6,737,334 B2 * | 5/2004 | Ho et al. .................. 438/424 |
| 2005/0118784 A1 | 6/2005 | Kim |
| 2006/0014361 A1 | 1/2006 | Kwon |

FOREIGN PATENT DOCUMENTS

| | | |
|---|---|---|
| KR | 10-2004-0091978 | 11/2004 |
| KR | 10-2005-0052179 | 6/2005 |
| KR | 10-2006-0037823 | 5/2006 |

* cited by examiner

*Primary Examiner*—David Vu
(74) *Attorney, Agent, or Firm*—Marshall, Gerstein & Borun LLP

(57) ABSTRACT

A method for forming an isolation layer in a semiconductor device comprises forming a trench inside a semiconductor substrate, forming a first high density plasma (HDP) oxide layer such that the first HDP oxide layer partially fills the trench, etching overhangs on sides of the trench by first cleaning with a hydrofluoric acid (HF) solution, subjecting a upper portion of the first HDP oxide layer to densification by second cleaning with an ozone (O3) solution, forming a liner HDP oxide layer having a high content of silicon (Si) over the first HDP oxide layer, and forming a second HDP oxide layer such that the second HDP oxide layer entirely fills the trench.

10 Claims, 6 Drawing Sheets

METHOD FOR FABRICATING ISOLATION FILM IN SEMICONDUCTOR DEVICE

CROSS-REFERENCE TO RELATED APPLICATION

The priority of Korean patent application number 10-2006-138819, filed on Dec. 29, 2006, which is incorporated by reference in its entirety, is claimed.

BACKGROUND OF THE INVENTION

The invention relates to a semiconductor device. More specifically, the invention relates to a method for forming an isolation layer in a semiconductor device capable of improving gap-fill margin upon deposition of an isolation layer.

In recent trends toward high-integration and fine-pattern semiconductor devices, there has been increased importance for shallow trench isolation (STI) techniques that exhibit superior device isolation performance with small width Formation of an isolation layer with a shallow trench isolation technique is generally carried out by forming a trench inside a semiconductor substrate, filling the trench with an insulating layer, and subjecting the resulting structure to planarization.

In forming the insulating layer for filling the trench, repetition of deposition-etching-deposition (DED) is used to improve gap-fill performance. During the repeated process, overhangs that results from the deposition of the insulating layer inside the trench having a small width, can be removed by etching. However, there is a limitation in applying the method for repeating deposition-etching-deposition to a trench having a low gap-fill margin due to the reduced size thereof.

FIGS. 1 and 2 are views illustrating defects resulted from formation of an isolation layer in a semiconductor device.

As shown in FIGS. 1 and 2, during etching used to remove overhangs occurring upon deposition of an insulating layer for filling the trench, the insulating layer undergoes surface-variation into a porous oxide layer. The porous oxide layer undergoes lifting and leave a lift defect A on the surface of a semiconductor substrate in the subsequent planarization and cleaning. Meanwhile, the surface of the insulating layer is attacked by a wet chemical for use in wet etching to remove the overhangs. As a result, a lift defect occurs, that is, the insulating layer is partially detached due to weaken binding force between the insulating layer and an oxide layer deposited in the following process.

As shown in FIG. 2, the lift defect A remaining on a wafer spreads over the overall wafer, thus causing a deterioration in the characteristics of the semiconductor substrate.

BRIEF SUMMARY OF THE INVENTION

One embodiment of the present invention relates to a method for forming a device isolation layer in a semiconductor device capable of preventing lift defect and improving gap-fill margin in formation of an isolation layer.

In accordance with one aspect, the invention provides a method for forming an isolation layer in a semiconductor device comprising: forming a trench inside a semiconductor substrate; forming a first high density plasma (HDP) oxide layer such that the first HDP oxide layer partially fills the trench; etching overhangs remaining on sides of the trench by first cleaning with a hydrofluoric acid (HF) solution; subjecting a upper portion of the first HDP oxide layer to densification by second cleaning with an ozone ($O_3$) solution; forming a liner HDP oxide layer having a high content of silicon (Si) over the first HDP oxide layer; and forming a second HDP oxide layer such that the second HDP oxide layer entirely fills the trench.

The method preferably further include preheating the semiconductor substrate, prior to the step of forming a first second HDP oxide layer.

The step of preheating preferably includes: first preheating by introducing an argon (Ar)-containing inert gas into the semiconductor substrate; and second preheating by introducing an oxygen ($O_2$) gas into the semiconductor substrate.

The step of forming a first HDP oxide layer may preferably include: (a) loading the semiconductor substrate in a high density plasma chamber; (b) depositing a liner high density plasma (HDP) oxide layer over the trench; (c) introducing a deposition source into the high density plasma chamber to form a bulk HDP oxide layer; (d) introducing an etching source into the high density plasma chamber to etch overhangs remaining on the trench; and (e) repeating the steps (b) to (d) to form a first HDP oxide layer filling the trench.

Preferably, the hydrofluoric acid (HF) solution may be a mixture of water ($H_2O$) and hydrofluoric acid (HE) in a ratio of 20:1. The second cleaning with an ozone ($O_3$) solution may be preferably carried out within 10 min.

The step of forming a liner HDP oxide layer is preferably carried out by introducing an oxygen ($O_2$) gas at a flow rate of 55 sccm to 60 sccm.

The method may preferably further comprise preheating the semiconductor substrate, prior to the step of forming a second HDP oxide layer. The preheating is preferably carried out for 5 min or less.

BRIEF DESCRIPTION OF THE DRAWINGS

The above and other aspects, features and other advantages of the invention will be more clearly understood from the following detailed description taken in conjunction with the accompanying drawings, in which.

DETAILED DESCRIPTION OF THE INVENTION

Figure 1:
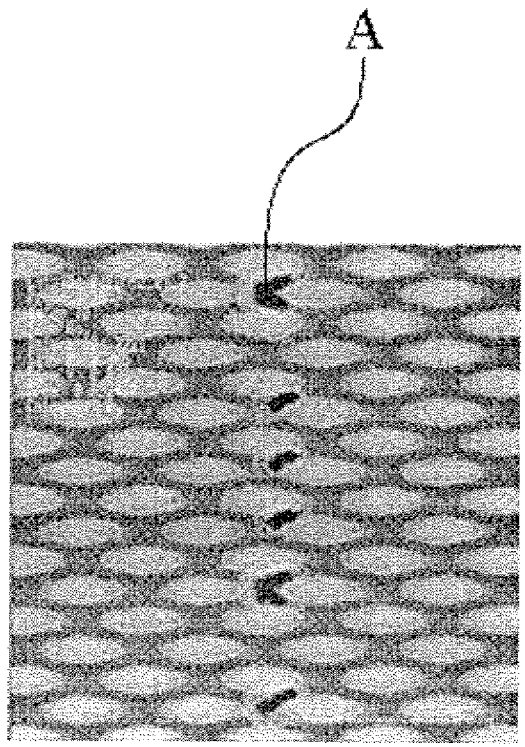
FIGS. 1 and 2 are views illustrating defects resulted from formation of an isolation layer in a semiconductor device.
Figure 2:
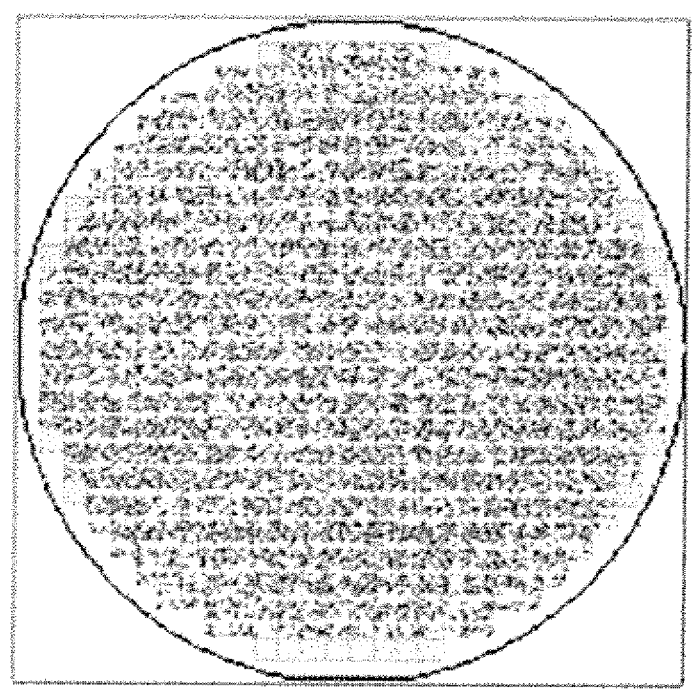

Exemplary embodiments of the invention are described below in detail with reference to the accompanying drawings. In the drawings, the thickness of each element of the invention is enlarged for a better understanding of the invention. Throughout the disclosure, the same or similar elements are denoted by the same reference numerals.

FIGS. 3 to 11 are cross-sectional views illustrating a method for forming an isolation layer in a semiconductor device according to one embodiment of the present invention.

Figure 3:
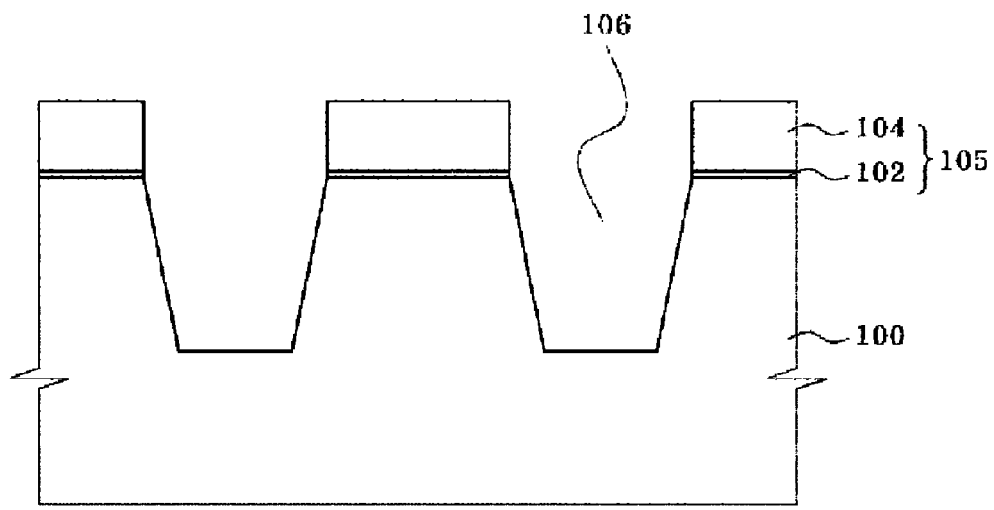
FIGS. 3 to 11 are cross-sectional views illustrating a method for forming an isolation layer in a semiconductor device according to one embodiment of the invention.
Figure 4:
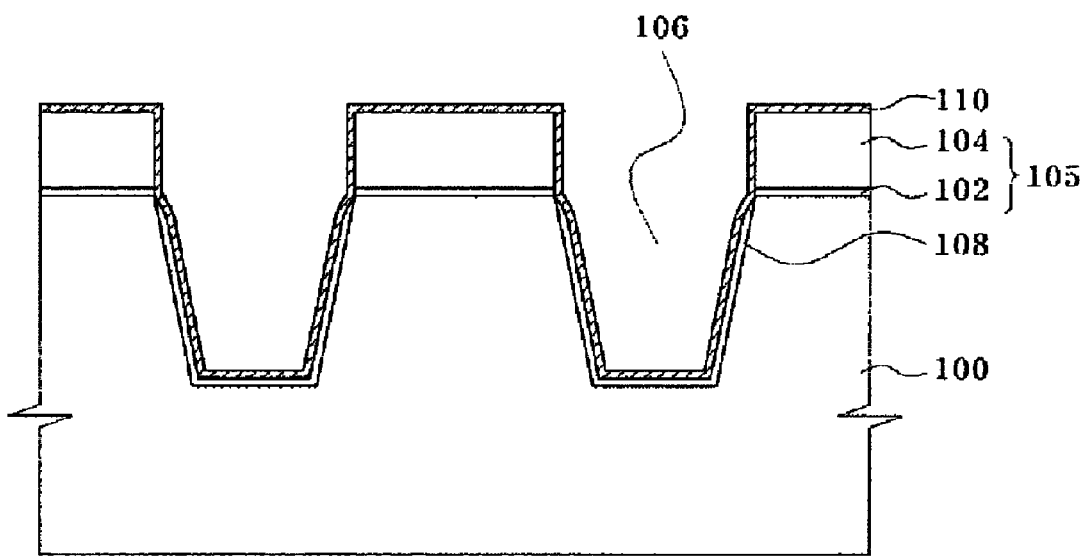

Referring to FIG. 3, a mask pattern 105 is formed over a semiconductor substrate to define a device isolation region.

More specifically, a pad oxide layer 102 and a pad nitride layer 104 are sequentially deposited over a semiconductor substrate 100. The pad oxide layer lessens the stress of the semiconductor substrate caused by attraction of the pad nitride layer. Although not shown, since the pad oxide layer and the pad nitride layer are formed in a furnace, they are also formed on the back of a wafer. Then, the pad oxide layer and the pad nitride layer are subjected to patterning to form a mask pattern 105 including the pad oxide pattern 102 and the pad nitride pattern 104 such that the surface of the semiconductor substrate 100 is partially exposed. The exposed region of the semiconductor substrate 100 is where an isolation layer is formed. Then, the exposed semiconductor substrate 100 is etched through the mask pattern 105 as an etching mask to form a trench 106 having a predetermined depth inside the semiconductor substrate 100.

Subsequently, the exposed region of the trench 106 is subjected to oxidization to form a sidewall oxide layer 108 thereon. A liner nitride layer 110 is deposited over the sidewall oxide layer 108. The sidewall oxide layer 108 serves as a buffer layer preventing an occurrence of the stress caused by direct deposition of the liner nitride layer 110 over the semiconductor substrate 100.

Figure 5:
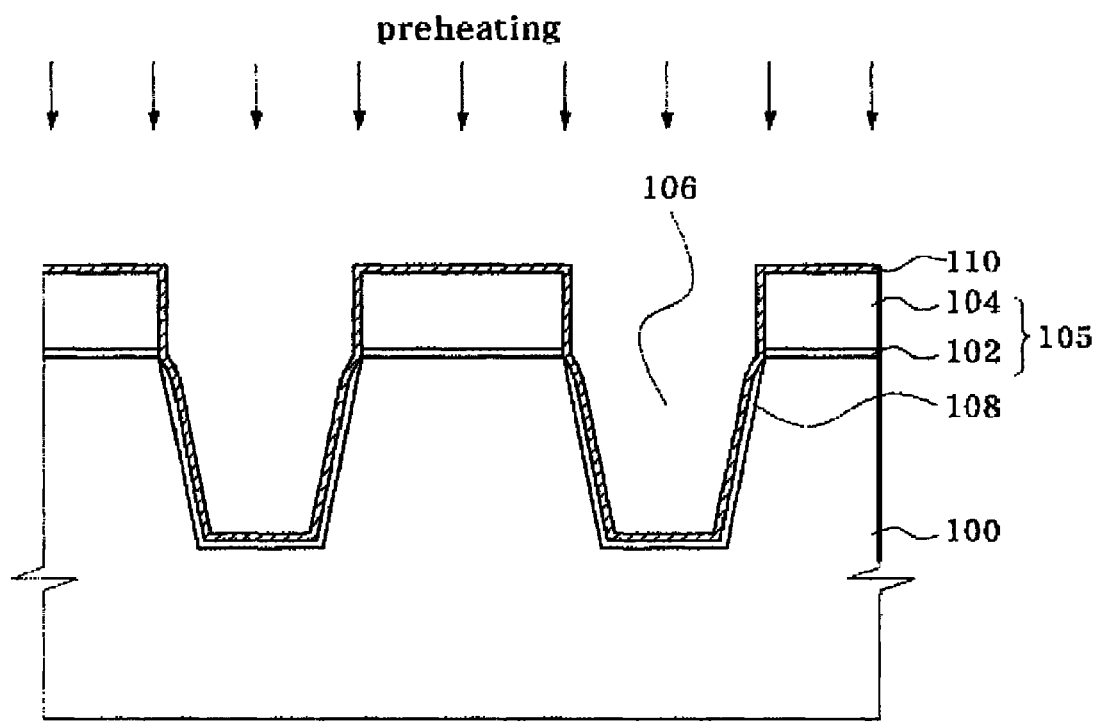

Referring to FIG. 5, the semiconductor substrate 100 is subjected to first preheating and second preheating to lower the stress between the sidewall oxide layer 108 and the liner nitride layer 110.

More specifically, the semiconductor substrate 100 is loaded in a high density plasma chamber. The semiconductor substrate 100 is subjected to first preheating for 50 sec to 60 sec by introducing argon (Air)-containing inert gas and helium (He) gases into the chamber while applying a desired voltage thereto. The argon (Ar)-containing inert gas is preferably introduced at a flow rate of 40 sccm to 60 sccm. The helium (He) is preferably introduced at a flow rate of 300 sccm to 500 sccm. The top power applied to generate plasma is 2,000 W to 3,000 W. The side power applied is preferably 2,000 W to 3,000 W.

Then, the semiconductor substrate 100 is subjected to second preheating. The second preheating is preferably carried out for 5 sec to 10 sec by introducing oxygen ($O_2$) and helium (He) gases into the chamber while applying a desired voltage thereto. The oxygen ($O_2$) is preferably introduced at a flow rate of 40 sccm to 60 sccm. The helium (He) is preferably introduced at a flow rate of 300 sccm to 500 sccm. The top power applied to generate plasma is preferably 2,000 W to 3,000 W. The side power applied is preferably 2,000 W to 3,000 W.

Figure 6:
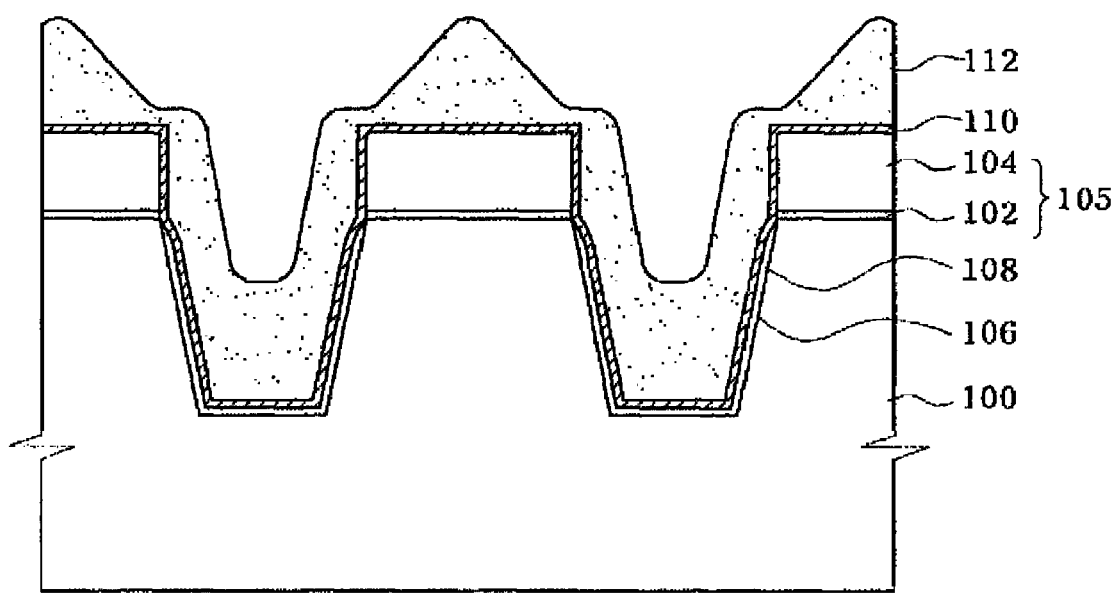

Referring to FIG. 6, a deposition source is introduced into the high density plasma chamber to form a liner high density plasma (HDP) oxide layer preferably to a thickness of 250 Å to 350 Å. The deposition source is further introduced into the chamber to form a bulk HDP oxide layer preferably to a thickness of 700 Å to 800 Å. Then, an etching source is introduced into the chamber to etch overhangs formed on the upper region of the trench during the formation of the bulk HDP oxide layer. A series of deposition of the bulk HDP oxide layer over the trench and etching overhang formed on the trench are repeated to form a first HDP oxide layer 112 partially filling the bottom and sides of the trench 106 and being deposited to a predetermined thickness over the mask layer pattern 105. At this time, the steps of preheating and forming the first HDP oxide layer 112 are carried out in-situ.

While the first HDP oxide layer 112 is deposited by repeating a series of depositing the bulk HDP oxide layer over the trench and etching any overhangs formed on the trench, it is modified into a porous layer. This is the reason that the first HDP oxide layer 112 is attacked by a wet chemical used to remove the overhangs.

Figure 7:
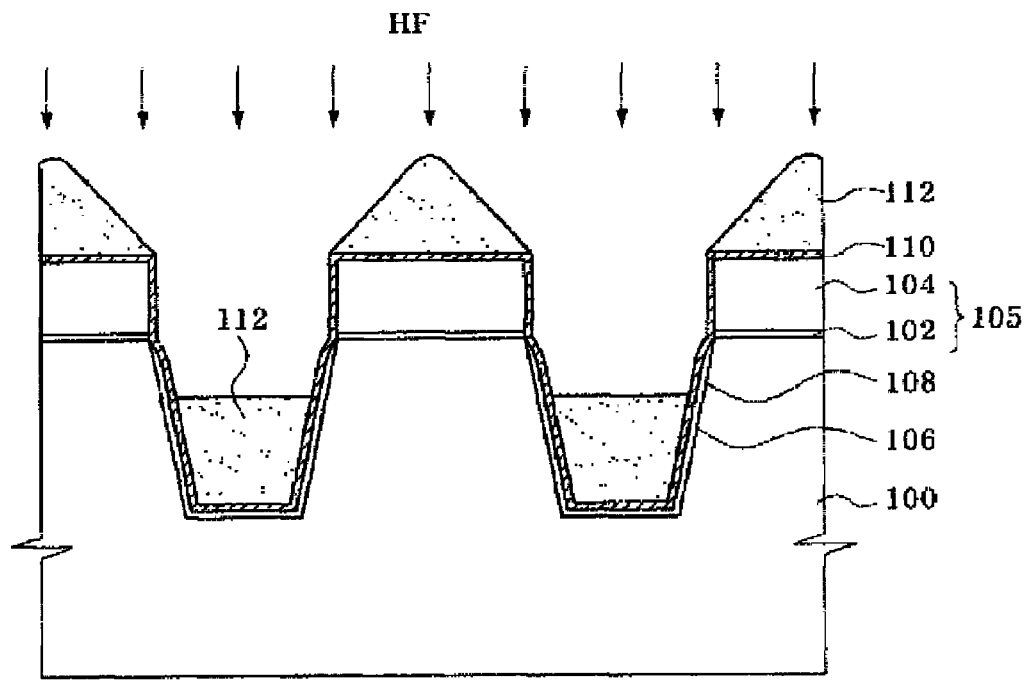

Referring to FIG. 7, the resulting structure including the semiconductor subsrate 100 is subjected to first cleaning with a hydrofluoric acid (HF) solution.

The hydrofluoric acid (HF) solution is a mixture of water ($H_2O$) and hydrofluoric acid (HF) preferably in a ratio of 20:1. The first HDP oxide layer 112 is probably etched to a thickness of about 300 Å by wet etching with the HF solution. As a result, the overhangs remaining on the trench are removed, thereby avoiding the deterioration in gap-fill performance.

Figure 8:
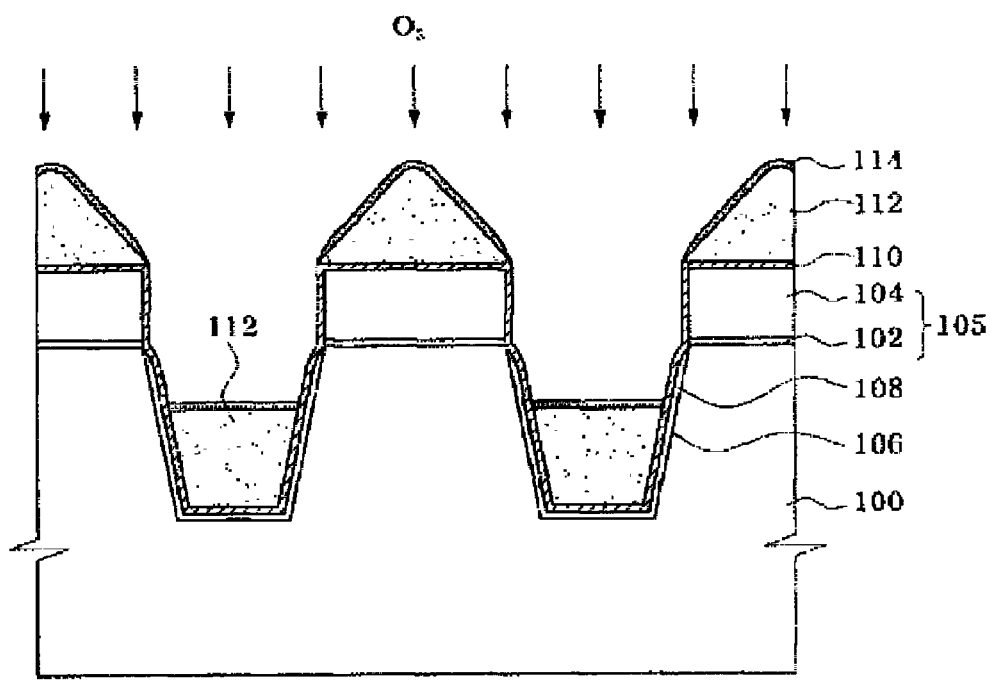

Referring to FIG. 8, the resulting structure is subjected to the second cleaning with an ozone ($O_3$) aqueous solution.

The second cleaning is preferably carried out with the ozone ($O_3$) aqueous solution (that is, a mixture of ozone ($O_3$) and deionized water (DIW)) within 10 min. During the second cleaning with the ozone ($O_3$) aqueous solution, a region preferably having a depth of about 7 Å toward the inside from the surface of the first HDP oxide layer becomes densified.

Figure 9:
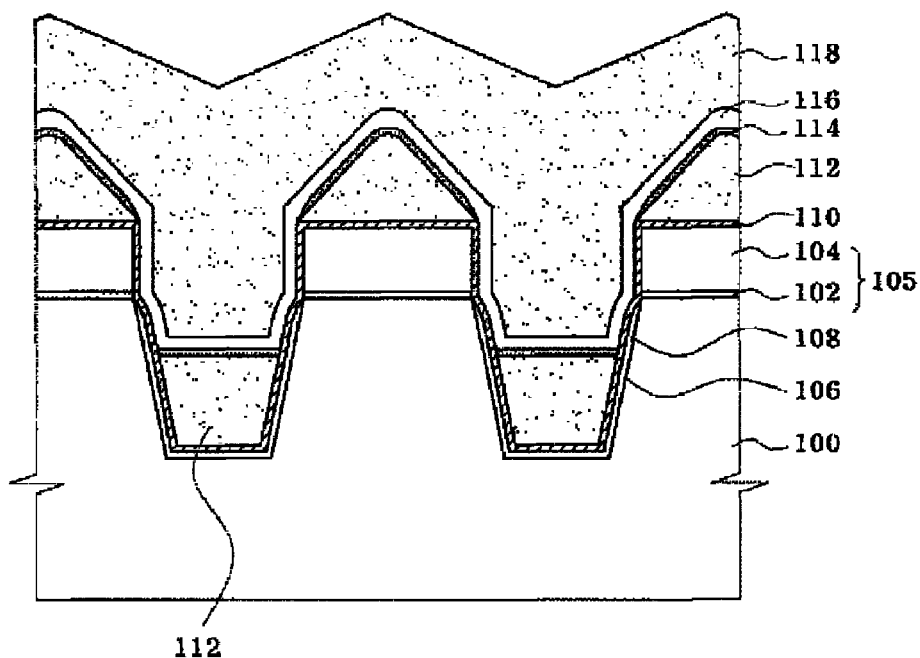

Referring to FIG. 9, a second HDP oxide layer 118 is formed such that it fills the trench 106. The procedure for forming the second HDP oxide layer 118 is described in detail below.

First, the resulting structure is subjected to a third preheating step. The third preheating step is carried out by introducing a helium (He) gas into the chamber while applying a desired power thereto. The helium (He) is preferably introduced at a flow rate of 1,000 sccm to 2,000 sccm. The third preheating is preferably carried out by applying a power of 1,500 W to 2,500 W at a low frequency (LF) for 3 sec to 7 sec.

Then, a liner HDP oxide layer 116 comprising a high content of silicon (Si) is formed on the first HDP oxide layer 112. The formation of the liner HDP oxide layer 116 is preferably carried out by introducing silane ($SiH_4$), oxygen ($O_2$) and helium (He) gases into the high density plasma chamber and applying an electric power thereto. The silane ($SiH_4$), oxygen ($O_2$), helium (He) gases are introduced at a flow ratio of 40 sccm to 50 sccm, 45 sccm to 55 sccm, and 800 sccm to 1,000 sccm, respectively. Plasma is preferably generated in the chamber by applying an electric power of 2,000 W to 4,000 W at a low frequency (LF) to the chamber. The plasma is preferably adsorbed on the semiconductor substrate 100 by applying electric power of 200 W to 400 W at a high frequency (HF), thereby forming a liner HDP oxide layer 116. At this time, the silicon (Si) content in the liner HDP oxide layer 116 is preferably adjusted to a desired high level by introducing oxygen ($O_2$) at a flow rate of 45 sccm to 55 sccm, which is lower than a flow rate of about 57 sccm used in formation of conventional liner HDP oxide layers.

Silane ($SiH_4$) is further introduced into the high density plasma chamber to form a second HDP oxide layer 118 filling the trench 116.

Figure 10:
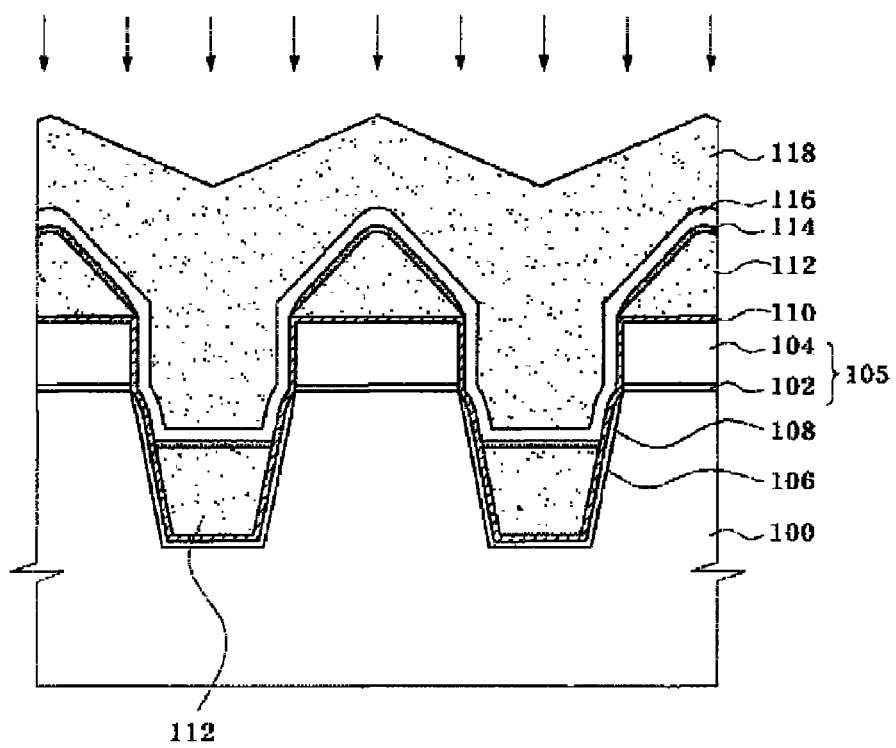

Referring to FIG. 10, the HDP oxide layer is subjected to densification by HDP annealing the semiconductor substrate 100 where the second HDP oxide layer 118 is deposited. The HDP annealing is preferably carried out at 800° C. to 1,200° C. for 40 min to 60 min highly preferably for about 50 min. The HDP annealing time is prolonged, when compared to 30 min of conventional annealing. The HDP annealing induces joining between the HDP oxide layer 114 surface-densified by the second cleaning with the $O_3$ solution, and the liner HDP oxide layer 116 having a high content of silicon (Si). As a result, the occurrence of lifting defect can be prevented owing to an improvement in adhesion between the first HDP oxide layer 112 and the second HDP oxide layer 118.

Figure 11:
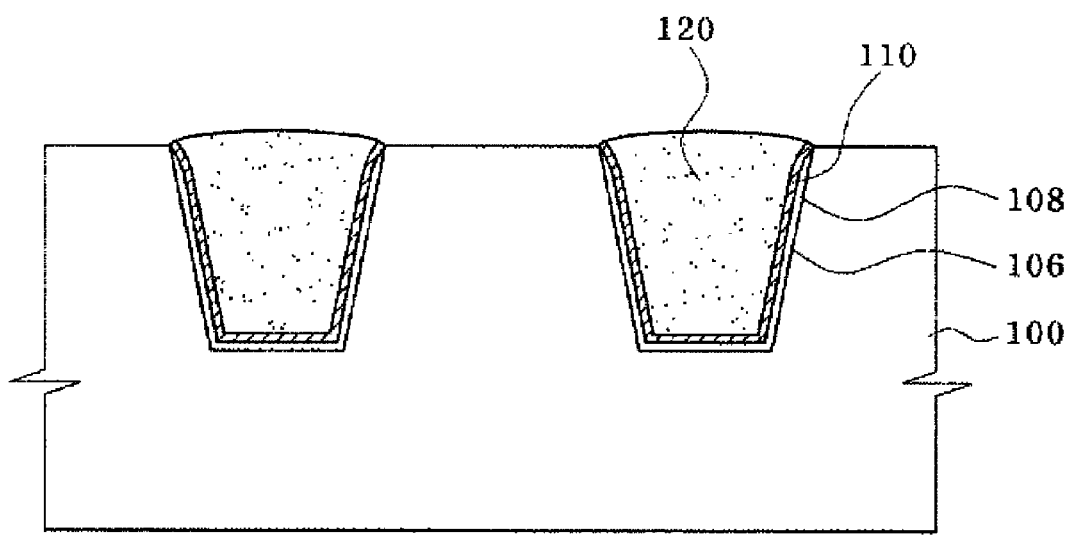

Referring to FIG. 11, the second HDP oxide layer 118 is subjected to planarization to form a trench isolation layer 120. The planarization of the second HDP oxide layer 118 is carried out by chemical mechanical polishing (CMP) or etchback.

In the method for forming an isolation layer in a semiconductor device according to the invention, first cleaning with the hydrofluoric acid (HF) solution and second cleaning with the ozone ($O_3$) solution are sequentially performed in deposition of the HDP oxide layer. As a result, lifting defects can be prevented from occurring on the interface of the HDP oxide layer. In addition, the lifting defects can be avoided via an improvement in the adhesion between the first HDP oxide layer 112 and the second HDP oxide layer 118 owing to the liner HDP oxide layer 116 having a high content of silicon (Si).

As apparent from the foregoing, the method for forming an isolation layer in a semiconductor device prevents lifting defects from occurring on the interface of a HDP oxide layer in deposition of the HDP oxide layer to fill a trench.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming an isolation layer in a semiconductor device comprising:
   forming a trench in a semiconductor substrate;
   forming a first high density plasma (HDP) oxide layer such that the first HDP oxide layer partially fills the trench;
   etching any overhangs remaining on sides of the trench by first cleaning with a hydrofluoric acid (HF) solution;
   subjecting an upper portion of the first HDP oxide layer to densification by a second cleaning with an ozone ($O_3$) solution;
   forming a liner HDP oxide layer having a high content of silicon (Si) over the first HDP oxide layer; and
   forming a second HDP oxide layer such that the second HDP oxide layer entirely fills the trench.

2. The method according to claim 1, further comprising:
   prior to the step of forming a first HDP oxide layer,
   preheating the semiconductor substrate.

3. The method according to claim 2, wherein the step of preheating includes:
   preheating by introducing an argon (Ar)-containing inert gas onto the semiconductor substrate; and
   then preheating by introducing an oxygen ($O_2$) gas onto the semiconductor substrate.

4. The method according to claim 1, wherein the step of forming a first HDP oxide layer includes:
   (a) loading the semiconductor substrate in a high density plasma chamber;
   (b) depositing a liner high density plasma (HDP) oxide layer over the trench;
   (c) introducing a deposition source into the high density plasma chamber to form a bulk HDP oxide layer;
   (d) introducing an etching source into the high density plasma chamber to etch any overhangs remaining on the trench; and
   (e) repeating steps (b) to (d) to form a first HDP oxide layer filling the trench.

5. The method according to claim 1, wherein the hydrofluoric acid (HF) solution is a mixture of water ($H_2O$) and hydrofluoric acid (HF) in a ratio of 20:1.

6. The method according to claim 1, wherein the second cleaning step with an ozone ($O_3$) solution is carried out within 10 min of the first cleaning step.

7. The method according to claim 1, wherein the step of forming a liner HDP oxide layer is carried out by introducing an oxygen ($O_2$) gas at a flow rate of 45 sccm to 55 sccm.

8. The method according to claim 1, further comprising:
   prior to the step of forming a second HDP oxide layer,
   preheating the semiconductor substrate.

9. The method according to claim 8, wherein the preheating step is carried out for 5 min or less.

10. The method according to claim 1, further comprising:
    after the step of forming a second HDP oxide layer,
    annealing the semiconductor substrate at 800° C. to 1,200° C. for 40 min to 50 min.

* * * * *